United States Patent
Boulard et al.

(10) Patent No.: US 12,495,638 B2
(45) Date of Patent: Dec. 9, 2025

(54) PROCESS FOR MANUFACTURING A LOW-NOISE PHOTODETECTOR DEVICE IN A CdHgTe SUBSTRATE

(71) Applicant: COMMISSARIAT À L'ÉNERGIE ATOMIQUE ET AUX ÉNERGIES ALTERNATIVES, Paris (FR)

(72) Inventors: François Boulard, Grenoble (FR); Jean-Paul Chamonal, Grenoble (FR); Clément Lobre, Grenoble (FR); Florent Rochette, Grenoble (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 545 days.

(21) Appl. No.: 17/995,605

(22) PCT Filed: Apr. 2, 2021

(86) PCT No.: PCT/FR2021/050587
§ 371 (c)(1),
(2) Date: Oct. 6, 2022

(87) PCT Pub. No.: WO2021/205102
PCT Pub. Date: Oct. 14, 2021

(65) Prior Publication Data
US 2023/0155043 A1    May 18, 2023

(30) Foreign Application Priority Data

Apr. 9, 2020 (FR) ........................ 2003595
Aug. 25, 2020 (FR) ........................ 2008678

(51) Int. Cl.
*H10F 77/123* (2025.01)
*H10F 30/222* (2025.01)
(Continued)

(52) U.S. Cl.
CPC ....... *H10F 77/1237* (2025.01); *H10F 30/222* (2025.01); *H10F 71/1253* (2025.01); *H10F 77/14* (2025.01); *H10F 77/933* (2025.01)

(58) Field of Classification Search
CPC ............... H10F 77/1237; H10F 30/222; H10F 71/1253; H10F 30/2212
See application file for complete search history.

(56) References Cited

U.S. PATENT DOCUMENTS

2014/0319580 A1* 10/2014 Mollard .............. H10F 71/1253
                                                            438/94
2016/0111580 A1*  4/2016 Gravrand ............ H10F 30/2215
                                                            438/73

FOREIGN PATENT DOCUMENTS

EP          0541973 A1    5/1993
EP          2937902 A1   10/2015
(Continued)

OTHER PUBLICATIONS

International Search Report for PCT/FR2021/050587 dated Jul. 8, 2021 and translation thereof.
(Continued)

*Primary Examiner* — Marlon T Fletcher
*Assistant Examiner* — Samuel Jonathan Smith
(74) *Attorney, Agent, or Firm* — Chrisman Gallo Tochtrop LLC

(57) ABSTRACT

A method for manufacturing a photodetection device, which includes the following steps:
making a cadmium-rich structured coating, over a substrate of $Cd_xHg_{1-x}Te$, and using a first etching mask; etching to enlarge the through openings of the first etching mask or the through openings of an interlayer etched with the structured coating, so as to form a second etching mask; injecting acceptor doping elements into the substrate, throughout the second etching
(Continued)

mask, and activating and diffusing the acceptor doping elements to form at least one P doped region in the semiconductor substrate; selective interdiffusion annealing of cadmium, so as to form in each P doped region a cadmium-rich concentrated well with a cadmium concentration lateral gradient; and making at least one electrical contact pad, at each through opening in the structured coating.

11 Claims, 5 Drawing Sheets

(51) Int. Cl.
*H10F 71/00* (2025.01)
*H10F 77/00* (2025.01)
*H10F 77/14* (2025.01)

(56) References Cited

FOREIGN PATENT DOCUMENTS

| EP | 3012876 A1 | 4/2016 |
| EP | 3157067 A1 | 4/2017 |
| FR | 3023976 A1 | 1/2016 |
| FR | 3042310 A1 | 4/2017 |
| WO | 2013079446 A1 | 6/2013 |

OTHER PUBLICATIONS

Written Opinion for PCT/FR2021/050587 dated Jul. 8, 2021.
Search Report for French application No. FR2003595 dated Sep. 30, 2020.
Search Report for French application No. FR2008678 dated May 11, 2021.

* cited by examiner

PROCESS FOR MANUFACTURING A LOW-NOISE PHOTODETECTOR DEVICE IN A CdHgTe SUBSTRATE

CROSS-REFERENCE TO RELATED APPLICATIONS

This is a National Stage application of PCT international application PCT/FR2021/050587, filed on Apr. 2, 2021, which claims the priority of French Patent Application No. 2003595, filed Apr. 9, 2020 and French Patent Application No. 2008678, filed Aug. 25, 2020, all of which are incorporated herein by reference in their entirety.

TECHNICAL FIELD

The invention relates to the field of infrared photodiodes made of $Cd_xHg_{1-x}Te$ (0<x<1), used to detect an infrared radiation in particular for infrared imaging applications.

STATE OF THE ART

A photodiode comprises a substrate made of a semiconductor material, in which a PN junction separates an N doped region from a P doped region. At thermodynamic equilibrium, a space charge area, devoid of free carriers, extends on either side of the PN junction and induces a high electric field in the photodiode.

In operation, either the N doped region or the P doped region forms an absorption region. When a photon with an adapted wavelength is absorbed in the absorption region, a so-called minority carrier is created therein. This minority carrier diffuses in the substrate until reaching the space charge area, where it is accelerated by the strong electric field towards the other doped region. Collection thereof in this other doped region forms an electric current. A photodiode is sensitive only in a determined wavelength range, which depends on the prohibited bandwidth, or gap, in the absorption region. A low value of the gap in the absorption region ensures a sensitivity of the photodiode to long wavelengths.

Different "parasitic" or "dark" currents, related to thermal agitation and to generation-recombination on defects, limit the performances of photodiodes. Positioning the charge area of the junction in a material with a higher gap value allows reducing the contribution of these undesirable currents.

Furthermore, it is known that in a semiconductor substrate of $Cd_xHg_{1-x}Te$ (alloy of cadmium, mercury and tellurium, with 0<x<1), the gap depends on the concentration of cadmium. The larger this concentration, the higher the gap will be.

Hence, a person skilled in the art had the idea to make $Cd_xHg_{1-x}Te$ photodiodes, with an absorption region having a low cadmium content, for the photodiode to be sensitive to long wavelengths, and a portion having a high cadmium content dedicated to the reduction of the dark current. In operation, at least one portion of the space charge area extends in the portion having a high cadmium content, which allows obtaining a reduced dark current. An example of such a photodiode is described in the patent application WO 2013/079446. In this document, the absorption region is N doped. A well having high cadmium content extends in the P doped region, with a substantially constant concentration of cadmium. The well is obtained by overlaying a $Cd_xHg_{1-x}Te$ substrate with a cadmium-rich layer, and by carrying out an interdiffusion annealing during which the cadmium atoms of the cadmium-rich layer will diffuse in the substrate, quite preferably in the P doped region.

A drawback of this solution is that it requires a trade-off on the composition of the well, to avoid the latter forming a potential barrier hindering the diffusion of the minority carriers in the space charge area. Hence, it must be ensured that the concentration of cadmium in the well does not exceed a critical threshold beyond which the sensitivity of the photodiode is strongly affected. This translates in the need for an accurate monitoring of the annealing conditions, to avoid the diffusion of an excessively large amount of cadmium towards the P doped region.

The present invention has an objective to provide a $Cd_xHg_{1-x}Te$ based photodetection device and the method for manufacturing the same, which provides sensitivity to long wavelengths as well as a reduced dark current, and which does not have the drawbacks of the prior art.

DISCLOSURE OF THE INVENTION

This objective is achieved with a method for manufacturing a photodetection device, which includes the following steps:
  a) depositing, over a semiconductor substrate of $Cd_xHg_{1-x}Te$, a source coating which includes, at least, one cadmium-rich layer having a higher average concentration of cadmium than the semiconductor substrate, with the cadmium-rich layer in direct physical contact with an upper face of the semiconductor substrate;
  b) making a first etching mask, superimposed on the source coating on the side opposite to the semiconductor substrate;
  c) a first etching step, to etch the source coating throughout a first etching mask and to thus form at least one first through opening in the source coating, the source coating fitted with the at least one first through opening being called structured coating;
  d) a second etching step, to enlarge at least one second through opening in a structure on top of the structured coating on completion of the first etching step, and to thus form a second etching mask;
  e) injecting acceptor doping elements into the semiconductor substrate, throughout through openings of the second etching mask, with the acceptor doping elements that locally cross the structured coating;
  f) activating and diffusing the acceptor doping elements, to form at least one P doped region in the semiconductor substrate;
  g) selective interdiffusion annealing of cadmium, implemented after step f) or at least partially simultaneously with step f), during which the cadmium atoms diffuse from the structured coating towards the at least one P doped region, so as to form in each P doped region a concentrated well with at least one intermediate gap area and at least one high gap area, where the intermediate gap area has an average concentration of cadmium strictly lower than the average concentration of cadmium in the high gap area; and
  h) depositing a metal layer coming into contact with the semiconductor substrate at the at least one first through opening in the structured coating, to form at least one electrical contact pad.

An underlying idea of the invention consists in making P/N type $Cd_xHg_{1-x}Te$ based photodiodes, in which the P doped region includes a cadmium-rich concentrated well, with a lateral gradient of the concentration of cadmium in the concentrated well. Like in the prior art, an average concentration of cadmium in the concentrated well is higher than an average concentration of cadmium in the N doped region (forming a respective PN junction with each P doped region). Hence, the average gap in the concentrated well is larger than the average gap in the N doped region. In operation, the space charge area extends at least partially in the concentrated well, which allows reducing the dark current. In each P doped region, the concentrated well includes at least one intermediate gap area and at least one high gap area. In operation, the space charge area extends partially in the intermediate gap area, and partially in the high gap area. The intermediate gap area has an average concentration of cadmium strictly lower than the average concentration of cadmium in the high gap area. Hence, the average gap in the intermediate gap area is smaller than the average gap in the high gap area. Collection of the carriers is ensured by an electrical contact pad, in direct physical contact with the P doped region at the intermediate gap area. For the collection of the carriers to remain possible, all it needs therefore is that the average gap in the intermediate gap area does not form a potential barrier hindering the diffusion of the minority carriers. Nevertheless, it is not inconvenient that the average gap in the high gap area hinders the diffusion of the minority carriers. In other words, the reduction of the dark current is ensured, at least, by the intermediate gap area, whereas the collection of the carriers is ensured, at least, by the intermediate gap area. Thus, in the high gap area, we get rid of the difficulties related to the pursue of a trade-off between a high gap to reduce the dark current to the maximum and a low gap to still enable the collection of the carriers. Furthermore, since the average gap in the high gap area can exceed a limit threshold beyond which it forms a potential barrier for the minority carriers, the average value of the gap in the concentrated well can be increased in comparison with the prior art. Hence, the dark current is reduced even further. Finally, since the high gap area ensures, alone, a considerable reduction of the dark current, the average gap in the intermediate gap area can be low enough to ensure a proper collection of the charge carriers regardless of the operating conditions (temperature, photons stream, etc.). Thus, a proper quantum efficiency of the photodetection device according to the invention is ensured.

Such a concentrated well may be obtained by overlaying a semiconductor substrate of $Cd_xHg_{1-x}Te$ with a cadmium-rich structured layer and by carrying out an interdiffusion annealing. During this annealing, the cadmium atoms of the structured layer will diffuse up to the substrate, mainly in the P doped region. The gradient of the cadmium concentration is obtained thanks to one or several through opening(s) pierced in the structured layer, each called "first through opening". Thus, an area in the P doped region located opposite a through opening in the structured layer forms an intermediate gap area, whereas an area in the P doped region located opposite a solid region of the structured layer forms a high gap area. Afterwards, the electrical contact pad is placed, in direct physical contact with a corresponding intermediate gap area. A difficulty that arises consists in ensuring a sufficient spacing between the PN junction and the electrical contact pad at the upper face of the semiconductor substrate, even for small-sized P doped regions, in order to avoid the apparition of tunnelling leakage currents.

This sufficient spacing may be obtained thanks to a proper alignment between the intermediate gap area and the electrical contact pad. Hence, an ingenious manufacturing method is provided in the present invention allowing guaranteeing in particular this proper alignment between the intermediate gap area and the electrical contact pad. It consists in structuring a layer forming a cadmium atoms reservoir using a first etching mask (step c) and then injecting the doping elements into the semiconductor substrate throughout the openings of a second etching mask (step e), with the second etching mask obtained by enlarging the openings of the first etching mask or of another etched structure throughout the first etching mask (step d). The through openings intended to be enlarged at step d) are called "second through openings". Thus, we obtain P doped regions aligned with the openings of the second etching mask, and therefore aligned with the openings of the first etching mask, and therefore aligned with the openings in the layer forming a cadmium atoms reservoir. The layer forming a cadmium atoms reservoir, structured throughout the first etching mask, is called structured coating. The interdiffusion annealing (step g) then forms, in the P doped regions, intermediate gap areas aligned with the openings in the structured coating. Hence, the electrical contact pads, in direct physical contact with the semiconductor substrate at the openings in the structured coating, are aligned in pairs with the intermediate gap areas. Alignment is obtained automatically, by construction, thanks to the injection of doping elements throughout the openings of a second etching mask obtained from the first etching mask. The proper alignment between an intermediate gap area and an electrical contact pad avoids the apparition of a leakage current at the PN junction, and also offers a proper homogeneity of the polarization of the PN junction in the device when in use.

According to an advantageous first embodiment, the method according to the invention includes the following features:
  at step b), the first etching mask is made directly over the source coating, on the side opposite to the semiconductor substrate; and
  at step d), the structure on top of the structured coating on completion of the first etching step is constituted by the first etching mask, so that the second etching mask is formed in the material of the first etching mask.

Advantageously, a thickness of the first etching mask is adapted so that, on completion of step d), the second etching mask has a thickness larger than or equal to a limit threshold below which, at step e), the acceptor doping elements would cross the second etching mask between the through openings of the latter.

According to an advantageous second embodiment, the method according to the invention further includes, between steps a) and b), a step of depositing a sacrificial layer over the source coating, on the side opposite to the semiconductor substrate, and:
  at step b), the first etching mask is made over the sacrificial layer, on the side opposite to the semiconductor substrate;
  at step c), the sacrificial layer is etched together with the source coating, throughout the first etching mask;
  at step d), the structure on top of the structured coating on completion of the first etching step is constituted by the etched sacrificial layer, so that the second etching mask is formed in the material of the sacrificial layer.

The method may further include a step of removing the first etching mask, implemented after step d) and before step e).

Preferably, at step d), an etching depth, in radial directions parallel to the plane of the semiconductor substrate, is larger than or equal to 1 μm.

Advantageously, the method according to the invention further includes a step of filling mercury gaps, to form in the semiconductor substrate an N doped region forming a respective PN junction with each P doped region.

On completion of step d), the second etching mask may include as many through opening(s) as the first etching mask.

Alternatively, at step d), several second through openings of the structure are combined so as to form one single through opening, so that on completion of step d) the second etching mask includes less through openings than the first etching mask.

The invention also covers a photodetection device with at least one pixel, obtained using a method according to the invention, and including:
- a $Cd_xHg_{1-x}Te$ semiconductor substrate;
- a structured coating, covering an upper face of the semiconductor substrate, and provided with at least one first through opening; and
- at least one electrical contact pad, made of metal;

wherein the semiconductor substrate includes, for each pixel:
- an N doped region;
- a P doped region, forming a PN junction with the N doped region, flush with the upper face of the semiconductor substrate, and in direct physical contact with a respective one amongst the at least one electrical contact pad; and
- a concentrated well, located only in the P doped region and having an average concentration of cadmium higher than the average concentration of cadmium in the N doped region.

In each pixel:
- the P doped region includes a base which extends from the upper face of the semiconductor substrate and at least one protrusion which projects from the base in the direction opposite to said upper face of the semiconductor substrate;
- the concentrated well features a cadmium concentration gradient, defining in the latter at least one intermediate gap area and at least one high gap area, with the intermediate gap area which has an average concentration of cadmium strictly lower than the average concentration of cadmium in the high gap area; and
- each intermediate gap area is in direct physical contact with said respective electrical contract pad, at least at one corresponding first through opening of the structured coating.

Preferably, each pixel includes one single intermediate gap area and one single high gap area, with the intermediate gap area arranged concentrically with the P doped region and surrounded by the high gap area.

BRIEF DESCRIPTION OF THE FIGURES

The present invention will be better understood on reading the description of embodiments provided for purely indicative and non-limiting purposes, with reference to the appended drawings in which.

DESCRIPTION OF THE EMBODIMENTS

In the following, an average concentration of cadmium refers to an average volume concentration of cadmium atoms.

To facilitate reading, the axes of an orthonormal reference frame (Oxyz) are represented in some figures.

FIGS. 1A to 1J illustrate the steps of a method according to a first embodiment of the invention, for manufacturing a photodetection device with at least one pixel, where each pixel of the device forms a photodiode.

Figure 1A:
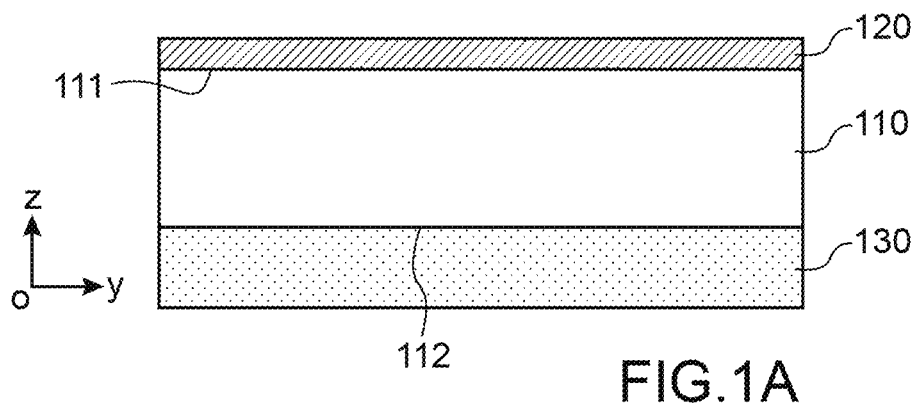
FIGS. 1A, 1B, 1C, 1D, 1E, 1F, 1G, 1H, 1I and 1J schematically illustrate the steps of a method according to a first embodiment of the invention.

In a first step, illustrated in FIG. 1A, a source coating 120 is deposited over a semiconductor substrate 110.

The semiconductor substrate 110 is constituted by an alloy of cadmium, mercury and tellurium of the type $Cd_xHg_{1-x}Te$, with x comprised between 0 and 1, excluding the limits. In this instance, it has two large faces parallel to the plane (xOy), which respectively define an upper face 111 and a lower face 112 of the substrate 110 (wafer-type thin substrate). Advantageously, the semiconductor substrate 110 is made using an epitaxy or a chemical vapor deposition over a support substrate 130. For example, the support substrate 130 is a CdZnTe, or silicon, or germanium based substrate, etc.

The average concentration of cadmium in the semiconductor substrate 110 is denoted x1, and comprised between x1=0.15 and x1=0.7, more preferably between x1=0.18 and x1=0.6, for example x1=0.3. These concentrations are adapted to absorption of wavelengths ranging from near-infrared to far-infrared.

The semiconductor substrate 110 further includes donor-type doping elements, for example indium, at a concentration comprised between $10^{13}$ and $10^{17}$ at·cm$^{-3}$, for example $10^{15}$ at/cm$^{-3}$.

In this instance, the concentration of cadmium is homogeneous in the entire volume of the semiconductor substrate 110, the same applying to the concentration of donor doping elements. Alternatively, the semiconductor substrate 110 may be constituted by several layers of $Cd_xHg_{1-x}Te$, superimposed along the axis (Oz), and each having a distinct value of the average concentration of cadmium, for example to make photodiodes sensitive in different wavelength ranges. Complementarily or alternatively, the concentration of donor-type doping elements may vary in the semiconductor substrate 110, for example to make photodiodes with improved collection or noise properties.

The source coating 120 is deposited directly over the semiconductor substrate, for example by physical vapor deposition, chemical vapor deposition, or molecular jet. The source coating 120 comprises, at least, one cadmium-rich layer whose average concentration of cadmium is higher than that of the semiconductor substrate 110 in a region of the latter flush with its upper face 111. Preferably, the average concentration of cadmium in the cadmium-rich layer is higher than the average concentration of cadmium in the entire semiconductor substrate 110. In this instance, the cadmium-rich layer is made of CdTe. Alternatively, the cadmium-rich layer may be made of $Cd_xHg_{1-x}Te$, with an average concentration of cadmium denoted x2, and with x2−x1≥0.1. The cadmium-rich layer extends in direct physical contact with the semiconductor substrate 110, in this instance over the entirety of the upper face 111 of the latter. For example, the cadmium-rich layer has a thickness comprised between 50 nm and 500 nm, for example 200 nm. In this instance, the source coating 120 is constituted by this unique cadmium-rich layer. Alternatively, the source coating 120 is constituted by a stacking of several layers, amongst which the cadmium-rich layer.

Figure 1B:
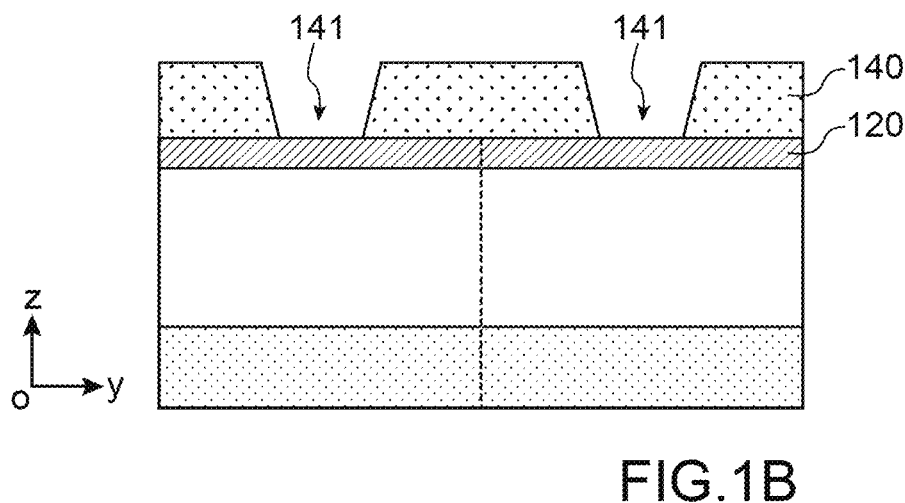

In a second step, illustrated in FIG. 1B, a first etching mask 140 is made over the source coating 120. In this instance, the first etching mask 140 extends directly over the source coating 120, in direct physical contact with the latter on the side opposite to the semiconductor substrate 110. The first etching mask 140 includes through openings 141, each extending across the entire thickness of the latter along the axis (Oz). In this instance, the through openings 141 have a disk-like shaped section in planes parallel to the plane (xOy), with the diameter of the disk which increases slightly when getting close to the source coating 120. For example, the diameter of the through openings 141 is 2 µm, at the interface between the first etching mask 140 and the source coating 120. Other shapes of through openings 141 may be implemented without departing from the scope of the invention. The first etching mask 140 may be made by depositing a photosensitive resin layer over the source coating 120 and then etching the resin layer, by photolithography, to make the through openings 141 therein.

At each step of manufacture thereof, it is possible to define pixels in the photodetection device according to the invention. In this instance, there is a through opening 141 of the first etching mask for each pixel. In the figures, the pixels are delimited by a dotted vertical line.

Figure 1C:
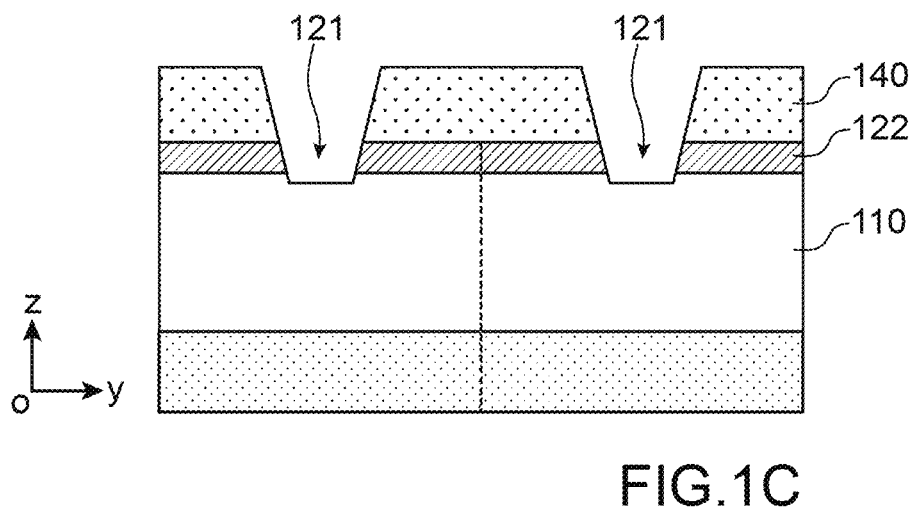

In a third step, illustrated in FIG. 1C, the source coating 120 is etched throughout the through openings 141 of the first etching mask 140, to form through openings 121 in the source coating 120, called "first through openings", each extending across the entire thickness of the latter along the axis (Oz). The source coating provided with through openings 121 is called structured coating 122. This step forms a first etching step, which may implement a dry or wet etching, whether reactive or not, or a combination of these techniques. Preferably, the first etching step implements a dry etching by ionic abrasion. The first etching step keeps the diameters of the through openings 141 of the first etching mask 140 substantially unchanged. In this instance, the first etching step also etches the semiconductor substrate 110, superficially (across a thickness smaller than 1000 nm, for example 200 nm). The first etching step also results in a slight reduction of the thickness of the first etching mask 140.

The first etching step allows making a structured coating 122 forming a cadmium reservoir, provided with through openings 121 each aligned with a respective through opening 141 of the first etching mask 140. Through openings 121 and 141, aligned in pairs and respectively belonging to the structured coating 120 and to the first etching mask 140, have substantially the same shape and the same dimensions in planes parallel to the plane (xOy).

Figure 1D:
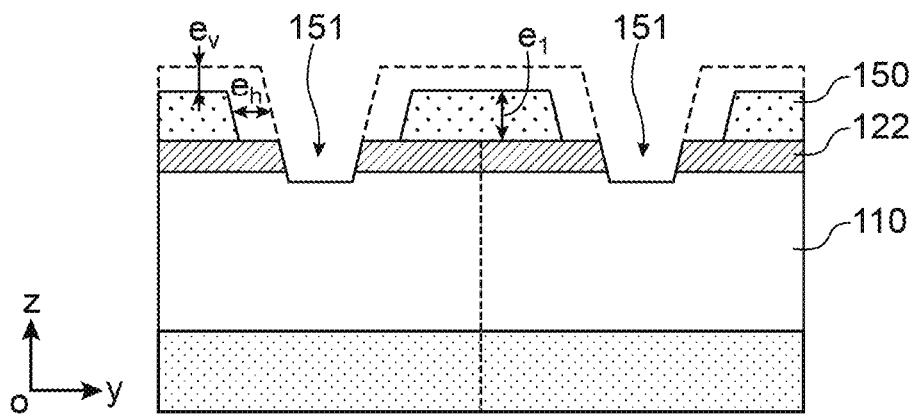
Figure 1E:
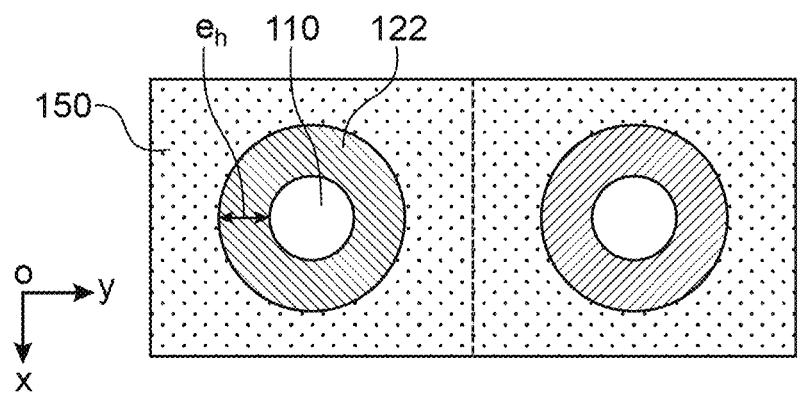

In a fourth step, illustrated in FIGS. 1D and 1E, the first etching mask 140 is etched so as to enlarge the through openings 141 of the latter, and thus form a second etching mask 150 from the first etching mask 140. The through openings 141 of the first etching mask are then called "second through openings". In FIG. 1D, a sectional view of the set obtained on completion of this second etching step is represented, with the shape of the first etching mask 140 just before this second etching step in dotted line. In FIG. 1E, there is represented a top view of this set.

Thus, the second etching step makes a second etching mask 150, with the through openings 151 of the second etching mask 150 aligned in pairs with the through openings 141 of the first etching mask 140, and with the through openings 151 of the second etching mask 150 larger than the through openings 141 of the first etching mask 140. Consequently, the through openings 121 of the structured coating 122 are aligned in pairs with the through openings 151 of the second etching mask 150, and the through openings 151 of the second etching mask 150 are larger than the through openings 121 of the structured coating 122. Hence, opposite each through opening 151 of the second etching mask 150, there is an area where the semiconductor 110 comes to surface surrounded with an area where the material of the structured coating 122 comes to surface (cf. FIG. 1E).

The second etching step implements a selective etching that does not etch the material of the structured coating 122. This second etching step may implement a reactive dry etching, for example a dioxygen-based plasma etching with the addition of Ar, $CF_4$, HBr, $Cl_2$, or a combination of these additives. The second etching step may consist of an isotropic etching, in which the vertical extent of etching (etching depth according to the axis (Oz)) is equal to the lateral extent of etching (etching depth in radial directions, located in the plane (xOy), orthogonal to the tangent to the edge of the through opening 141 of the first etching mask). Alternatively, the method according to the invention may be adapted so that at the second etching step, the lateral extent of etching is strictly larger than the vertical extent of etching, by a factor comprised for example between 1.2 and 2. Thus, it is possible to limit the reduction of the thickness of the first etching mask 140 imparted by the second etching step, for the same width of the through openings 151 of the second etching mask 150. This etching property may be obtained by a stiffening of the upper face of the first etching mask 140, for example through a second etching step implementing an ion stream bombing the upper face of the first etching mask in a plasma etching process. Alternatively, this property may be obtained by depositing a precursor over the upper face of the first etching mask 140, slowing down a vertical chemical etching.

In FIG. 1D, the vertical extent $e_v$ of etching, along the axis (Oz), and the radial extent $e_h$ of etching, in radial directions located in planes (xOy) are represented. The thickness $e_1$ of the second etching mask 150 is also represented, corresponding to the thickness of the first etching mask decreased by the vertical extent $e_v$ of etching.

Figure 1F:
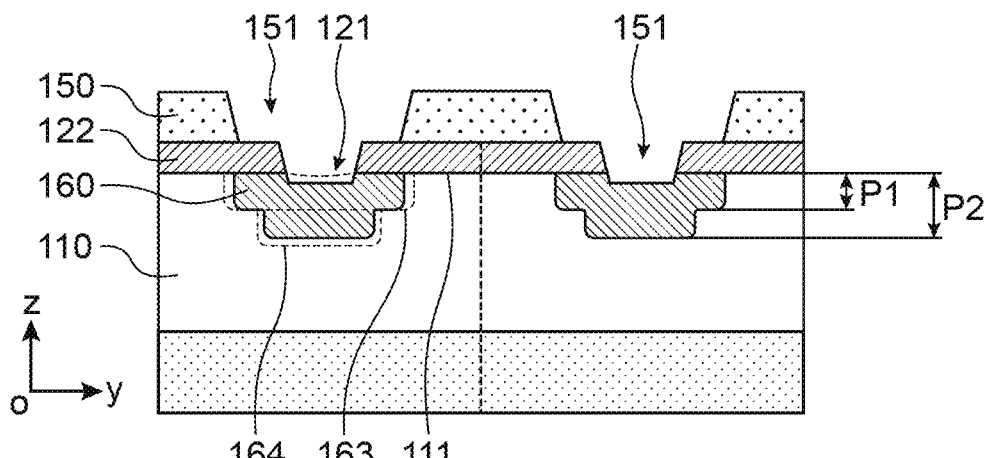

In a fifth step, illustrated in FIG. 1F, acceptor doping elements are injected into the semiconductor substrate 110, throughout the through openings 151 of the second etching mask 150. For example, the acceptor doping elements consist of arsenic atoms, injected by ionic implantation with an energy of 400 keV, and a dose of $5 \cdot 10^{14}$ at·$cm^{-3}$. After a step of activating and diffusing the injected doping elements, these form P doped regions 160 in the semiconductor substrate.

The doping elements injected opposite the solid areas of the second etching mask 150 do not reach the semiconductor substrate 110. For this purpose, the thickness $e_1$ of the second etching mask 150 must remain larger than or equal to a predetermined threshold value. We understand herein the relevance of limiting a reduction of the thickness of the first etching mask 140, during the previous steps. In particular, the thickness $e_1$ must remain larger than or equal to a threshold value, below which the doping elements injected opposite the solid areas of the second etching mask 150 would cross this second etching mask 150 across the entire thickness thereof. For example, this threshold value is 0.8 µm, under the above-mentioned implantation conditions.

Furthermore, the doping elements injected opposite the through openings 151 of the second etching mask, in an area where the material of the structured coating 122 comes to surface, sink up to a first depth P1 in the semiconductor substrate 110.

Finally, the doping elements injected opposite the through openings 151 of the second etching mask, in an area where the semiconductor substrate 110 comes to surface, sink up to a second depth P2 in the semiconductor substrate 110, with P2 strictly larger than P1. For this purpose, the thickness of the structured coating 122 (and therefore of the source coating 120) must remain smaller than or equal to a predetermined threshold value. Said predetermined threshold value depends on the nature of the injected doping elements and on the implantation energy. In this instance, the structured coating 122 has a 200 nm thickness, enabling arsenic atoms implanted with an energy of 400 keV to reach the semiconductor substrate 110.

Thus, P doped regions are obtained each with a base 163, extending from the upper face 111 of the semiconductor substrate 110, and a protrusion 164, projecting from the base in the direction opposite to the upper face 111 of the semiconductor substrate. The width of the base 163 is defined by the width of the corresponding through opening 151 in the second etching mask 150. The width of the protrusion 164 is defined by the width of the corresponding through opening 121 in the structured coating 122. In this instance, each P doped region 160 is centred on a respective through opening 151 of the second etching mask 150, and on a respective through opening 121 of the structured coating 122. In each P doped region, a central area is surmounted by the respective through opening 121 of the structured coating 122, and a peripheral area is surmounted by the material of said structured coating 122. Each P doped region is associated to a respective pixel of the photodetection device being manufactured.

Figure 1G:
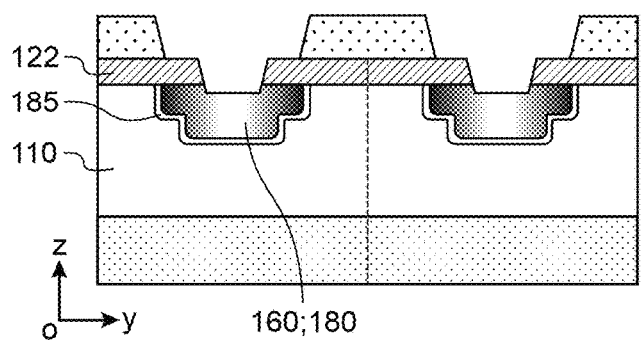
Figure 1H:
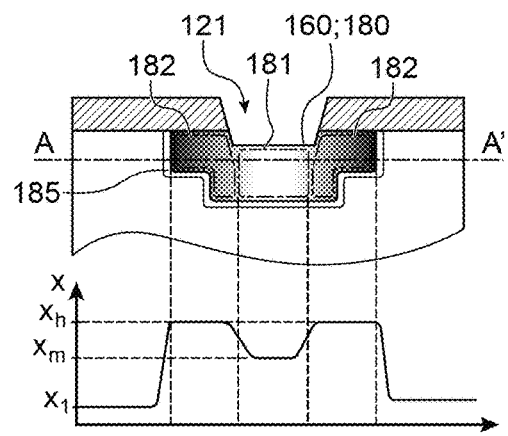
Figure 1I:
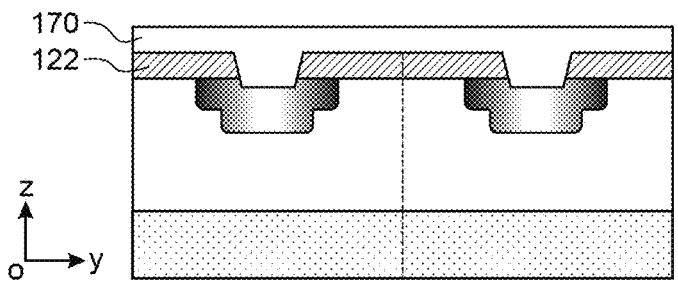

In a sixth step, illustrated in FIGS. 1G and 1H, a selective interdiffusion annealing of cadmium is carried out, during which the cadmium atoms of the structured coating 122 diffuse towards the semiconductor substrate 110. Preferably, this annealing comprises a high-temperature annealing phase, at a temperature comprised between 100° C. and 500° C., more preferably between 300° C. and 500° C. and even between 350° C. and 450° C., and for a time period longer than one minute, preferably comprised between 10 minutes and 50 hours, still between 30 minutes and 50 hours, and even between 30 minutes and 30 hours, for example one hour.

During this annealing, cadmium preferably diffuses in the P doped regions 160. Hence, we talk about a selective interdiffusion. Thus, a distribution of cadmium in the semiconductor substrate 110 is obtained, with a high average concentration of cadmium in the P doped region 160 of each pixel. In each pixel, the concentration of cadmium rapidly decreases, in an intermediate area 185 which extends at the interface between the P doped region 160 and the remainder of the semiconductor substrate (this interface corresponding to the future PN junction). Said intermediate area 185 may extend on either side of the future PN junction. Preferably, said intermediate area 185 extends on both sides of the future PN junction. Thus, it is possible to define, in each P doped region, a respective concentrated well 180 which has an average concentration of cadmium higher than the average concentration of cadmium in the remainder of the semiconductor substrate 110. Each concentrated well 180 extends only inside the corresponding P doped region, and therefore does not necessarily include the intermediate area 185. Each concentrated well 180 and the corresponding P doped region 160 are arranged concentrically. In the following, we consider that the each concentrated well 180 is exactly superimposed with the corresponding P doped region 160.

Cadmium diffuses in the P doped areas 160, from overlay surfaces between the P doped regions 160 and the structured coating 122. Thus, in each P doped region 160, the concentrated well 180 features a lateral gradient of cadmium. In the concentrated well 180, the concentration of cadmium is maximum opposite the overlay surface between the P doped region 160 and the structured coating 122, then decreases when getting away from this overlay surface. Thus, it is possible to define, in the concentrated well 180, an intermediate gap area surrounded by a high gap area.

In FIG. 1H, there is represented a detail view of the set obtained on completion of the interdiffusion annealing, and a corresponding profile of the concentration x of cadmium along an axis AA' parallel to the plane (xOy) and passing through the doped region P. The concentration of cadmium takes on:

a low value $x_l$ outside the P doped region and the intermediate area 185, and a high value $x_h$, in the P doped region and opposite the overlay surfaces between the P doped region and the structured coating 122.

An area of abrupt transition from the low value $x_l$ to the high value $x_h$ corresponds to the intermediate area 185 as mentioned hereinabove. The high value $x_h$ is strictly higher than the low value $x_l$, preferably with $x_h \geq (x_l+0.1)$. Furthermore, the high value $x_h$ is advantageously 1.5 to 5 times higher than $x_l$. There is no restrictive limitation to limit the maximum value assigned to $x_h$, this value may reach $x_h=0.95$.

Opposite the openings 121 of the structured coating 122, the concentration of cadmium varies progressively from the high value $x_h$ down to an intermediate value $x_m$. The intermediate value $x_m$ is strictly lower than $x_h$. Preferably, the intermediate value $x_m$ further meets $x_{ab} \leq x_m \leq (x_{ab}+0.1)$, with $x_{ab}$ the concentration of cadmium in a region of the semiconductor substrate 110 dedicated to the absorption of incident photons. For simplicity, it is possible to consider that $x_l = x_{ab}$. It is possible to define the intermediate gap area as being the volume 181, in the concentrated well 180, located opposite the through opening 121 in the structured coating 122. Similarly, it is possible to define the high gap area as being the volume 182, in the concentrated well, located opposite solid areas of the structured coating 122.

In operation, in the photodetection device obtained ultimately, each P doped area defines a PN junction with the remainder of the semiconductor substrate 110, and a space charge area extends on either side of this PN junction, partially in the concentrated well 180. An N doped region of the semiconductor substrate forms an absorption region, dedicated to the absorption of incident photons. The wavelength of the absorbed photons depends on the gap in said N doped region. Thanks to the higher average concentration of cadmium in the concentrated well 180, the photodetection device can detect photons at long wavelengths while having a reduced dark current. In each P doped region, the collection of the charge carriers is carried out at the intermediate gap area 181. Consequently, the possible presence of a potential barrier at the high gap area 182 does not prevent an effective collection of the charge carriers. Hence, it is possible to increase an average value of the gap in the space charge area, in comparison with the prior art, and thus reduce even further the dark current for the same spectral sensitivity range.

On completion of this annealing, or alternatively prior to annealing, the second etching mask 150 is removed. Afterwards, in a seventh step illustrated in FIG. 1I, the obtained set is covered with a metal layer 170, for example deposited by evaporation. The metal layer 170 may be constituted by one single layer or by a multilayer stacking, and may comprise one or several element(s) such as gold, titanium, nickel, an alloy of metals, etc. The metal layer 170 covers the structured coating 122 and penetrates inside the through openings 121 in the latter. Hence, it is in direct physical contact with the P doped regions, only at the through openings 121 in the structured coating, opposite the intermediate gap areas.

Figure 1J:
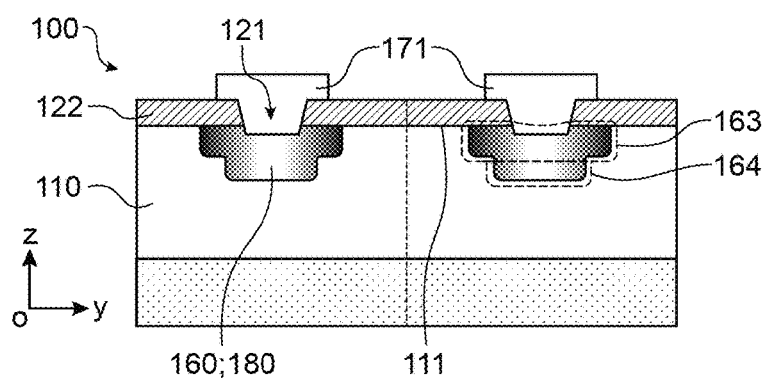

In an eighth step, illustrated in FIG. 1J, the metal layer 170 is etched locally, for example by photolithography and etching, to delimit electrical contact pads 171.

Alternatively to the seventh and eighth steps, the metal layer is deposited over a mask made over the structured coating, then the mask is removed so that only the electrical contact pads remain (a so-called lift-off technique).

In all cases, electrical contact pads are thus made, with a narrow contact surface between the electrical contact pad and the P doped region, automatically aligned on the intermediate gap area. Thus, an effective collection of the charge carriers is ensured in operation. Furthermore, a sufficient spacing between the electrical contact pad and the PN junction is thus ensured, preventing the apparition of tunnelling leakage currents.

The spacing between the electrical contact pad and the PN junction is defined by the radial extent $e_h$ of etching (or etching depth in radial directions parallel to the plane (xOy) of the semiconductor substrate 110), at the second etching step (cf. FIGS. 1D and 1E). Preferably, this radial extent $e_h$ is larger than or equal to 1 μm, even larger than or equal to 1.5 μm, for example equal to 2 μm. In other words, at the second etching step, the at least one through opening is enlarged so that its diameter is increased by at least 2 μm, even by at least 3 μm, for example increased by 4 μm (where the diameter of the through opening is the largest width of a section of said through opening in a plane (xOy) parallel to the plane of the semiconductor substrate).

This radial extent $e_h$ also defines the dimensions of an exchange surface between the solid areas of the structured coating 122 and a P doped region, and therefore participates in defining a profile of the gap gradient in the concentrated well and a maximum threshold of the gap in the concentrated well.

The method according to the invention also includes an annealing step, which is not represented, at low temperature under saturating mercury vapor pressure, to fill mercury gaps formed in the semiconductor substrate 110 and form respective PN junctions between the P doped regions 160 and the remainder of the semiconductor substrate 110. This annealing may be implemented after the selective interdiffusion annealing of cadmium. Alternatively, this annealing may form a final low-temperature phase of the selective interdiffusion annealing of cadmium. The low-temperature annealing is carried out at a temperature comprised for example between 150° C. and 200° C.

Similarly, the aforementioned step of activating and diffusing the injected acceptor doping elements may be implemented before or at least partially during the selective interdiffusion annealing of cadmium.

Subsequent steps of hybridization on a reading circuit, optional removal of the support substrate, depositing optical functions over the front face such as anti-reflective layers and/or filters, etc., are not described but may be implemented without departing from the scope of the invention.

In an advantageous embodiment, the first etching mask 140 has a 3 μm thickness and circular through openings with a 2 μm diameter evenly distributed in the plane (xOy) with a distribution step equal to 10 μm. At the first etching step, the source coating is etched by ionic abrasion to form the structured coating. This first etching step also reduces the thickness of the first etching mask 140. For example, the first etching step etches through openings in a 0.2 μm thick source coating, and leads to a 0.2 μm reduction of the thickness of the first etching mask 140. Afterwards, the first etching mask is etched by dioxygen plasma, with a 2 μm extent of etching in all directions. Thus, a 0.8 μm thick second etching mask 150 is obtained, with circular through openings with a 6 μm diameter distributed with a distribution step equal to 10 μm. The thickness of the second etching mask 150 is sufficient to stop the implantation of arsenic, injected by ion implantation with an energy of 400 keV and a dose of $5 \cdot 10^{14}$ at·cm$^{-3}$. In the ultimate photodetection device, a spacing between the edges of the electrical contact pad 171 and the edges of the PN junction, in the plane of the upper face 111 of the semiconductor substrate, and thus larger than or equal 2 μm.

FIG. 1J shows the photodetection device 100 obtained using the above-described method. The photodetection device 100 includes the semiconductor substrate 110 of $Cd_xHg_{1-x}Te$, surmounted by the structured coating 122. The structured coating includes, at least, one cadmium-rich layer in direct physical contact with the semiconductor substrate 110. Even after the interdiffusion annealing, the average concentration of cadmium in the cadmium-rich layer is higher than the average concentration of cadmium in the semiconductor substrate 110 (cadmium diffusing in only part of the semiconductor substrate). In each pixel of the device 100, a respective P doped region 160 extends in the semiconductor substrate 110, and defines a PN junction with the remainder of the semiconductor substrate 110. Each P doped region includes a base 163 and a protrusion as previously described. Each protrusion 164 is aligned with a respective through opening 121 of the structured coating 122, and substantially has the same section as said through opening 121 in planes parallel to the plane (xOy). The volume of the protrusion 164 is strictly smaller than that of the base 163. Each P doped region 160 receives a respective concentrated well 180, as previously described, with a high gap area and an intermediate gap area. In this instance, the intermediate gap area is arranged concentrically with the P doped region 160, and surrounded by the high gap area. The intermediate gap area is in direct physical contact with a respective electrical contract pad 171, at a respective through opening 121 of the structured coating. At the upper face 111 of the semiconductor substrate 110, the edges of the electrical contact pad 171 are spaced apart from the PN junction defined by the P doped region 160.

In each pixel, a distance between the edges of the PN junction and the edges of the through opening 121 in the structured coating, in the plane of the upper face 111 of the semiconductor substrate 110 and in radial directions, is advantageously larger than or equal to a threshold value D. In this instance, the radial direction is a direction orthogonal to the tangent to the edge of the through opening 121, in the plane of the upper face 111 of the semiconductor substrate 110. Similarly, a distance between the edges of the PN junction and the edges of the electrical contact pad 171 is advantageously larger than or equal to the threshold value D, in the plane of the upper face 111 of the semiconductor substrate 110 and in radial directions. Preferably, the threshold value is 1.0 µm, or 1.5 µm, or even 2.0 µm. Similarly, a distance between the edges of the base 163 and the edges of the protrusion 164, in an orthogonal projection of the P doped region 160 in a plane parallel to the plane (xOy), is advantageously larger than or equal to the threshold value D.

Thus, the method according to the invention allows manufacturing a photodetection device with a low noise level. The method implements a reduced number of manufacturing steps, which improves the robustness of the manufactured device and increases manufacturing productivity.

The structured coating 122 forms a passivation layer, protecting the semiconductor substrate 120. In the method according to the invention, the P doped regions 160 are made after etching the through openings 121 of the structured coating. Thus, interface states constraints are limited, which allows resorting to very accurate etching processes for etching the through openings 121, for example anisotropic dry etching processes. Thus, it is possible to reduce a contact surface between the electrical contact pad and the corresponding P doped region, and reduce a pixel step of the device according to the invention.

Figure 2A:
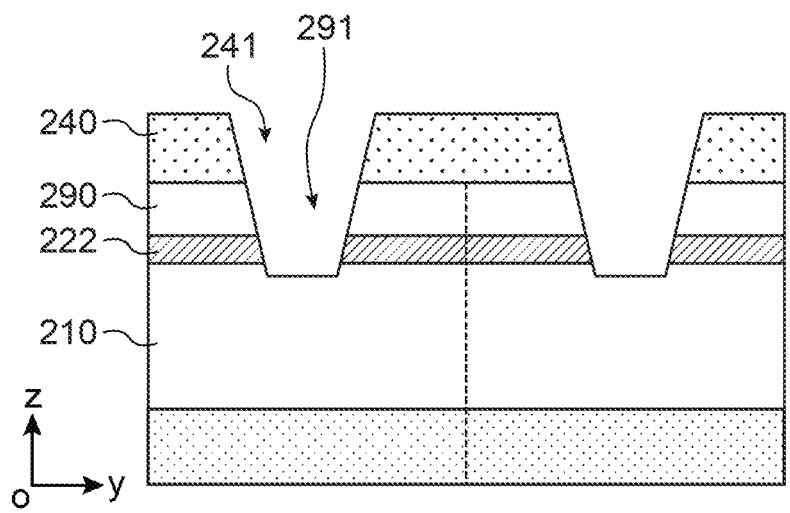
FIGS. 2A, 2B and 2C schematically illustrate the steps of a method according to a second embodiment of the invention.
Figure 2B:
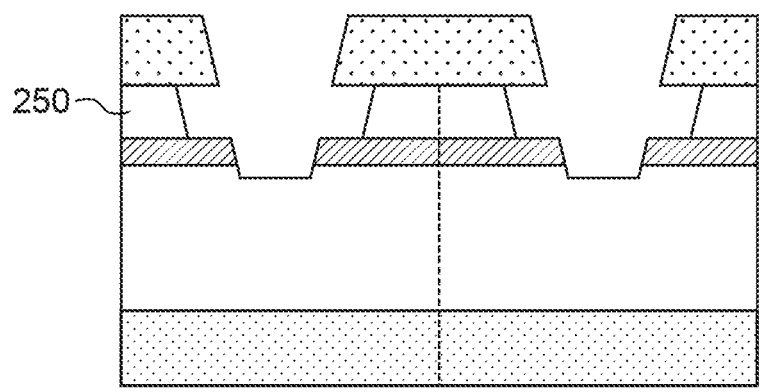
Figure 2C:
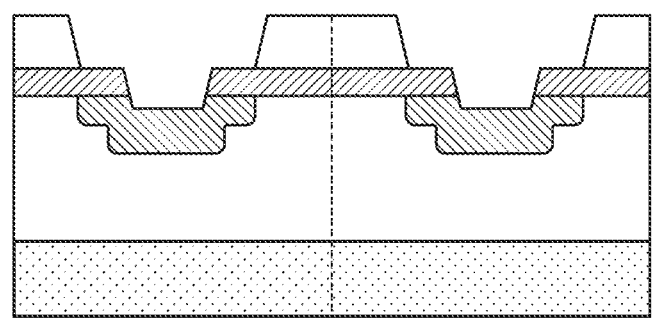

FIGS. 2A to 2C illustrate the steps of a method according to a second embodiment of the invention, which will be described only for its differences with regards to the method according to the first embodiment of the invention. In this second embodiment, the method includes the following steps:
- depositing, over the source coating and on the side opposite to the semiconductor substrate 210, a sacrificial layer 290. In this instance, the sacrificial layer 290 is in direct physical contact with the source coating over the entirety of the extent thereof in a plane (xOy).
- making first etching mask 240, as previously described, in this instance over the sacrificial layer 290, on the side opposite to the semiconductor substrate 210. In this instance, the etching mask 240 is in direct physical contact with the sacrificial layer 290.
- joint etching of the sacrificial layer 290 and of the source coating, throughout the through openings 241 of the first etching mask 240 (cf. FIG. 2A). This first etching step forms through openings 291 in the sacrificial layer 290, with the through openings 241 of the first etching mask 240 and the through openings 291 of the sacrificial layer 290 aligned in pairs and having substantially the same width. This first etching step further forms the structured coating 222 as previously described, with the through openings of the structured coating 222 and the through openings 291 of the sacrificial layer 290 aligned in pairs and having substantially the same width.
- a second etching step, to enlarge the through openings 291 of the sacrificial layer 290 (cf. FIG. 2B). The through openings 291 of the sacrificial layer 290 are then called "second through openings". The sacrificial layer whose through openings are enlarged forms a second etching mask 250 as previously described. For example, the sacrificial layer is made of SiO$_2$, etched by wet etching in a hydrofluoric acid based acid solution.
- after removing the first etching mask 240, injections of acceptor doping elements throughout the through openings of the second etching mask, as previously described (FIG. 2C).

The steps are followed by the previously-described steps of selective interdiffusion annealing of cadmium, removing the second etching mask and making electrical contact pads.

The dimensions of the second etching mask must meet the same requirements as in the first embodiment. In particular, the thickness of the sacrificial layer 290 must be sufficient to prevent the injected acceptor doping elements from reaching the semiconductor substrate 210. For an ion implantation of arsenic at 400 keV, it is possible to use for example a sacrificial layer made of SiO$_2$, with a thickness larger than or equal to 500 nm.

At the second etching step, the sacrificial layer 290 intended to form the second etching mask is etched only in the radial directions. The extent of etching in the radial directions may be easily adjusted, in particular by a duration of contact with an acid solution and/or an acid concentration. In the vertical direction, the sacrificial layer is protected by the first etching mask, so that its thickness remains unchanged. Hence, the second embodiment facilitates the adjustment of the dimensions of the through openings of the second etching mask.

Figure 3:
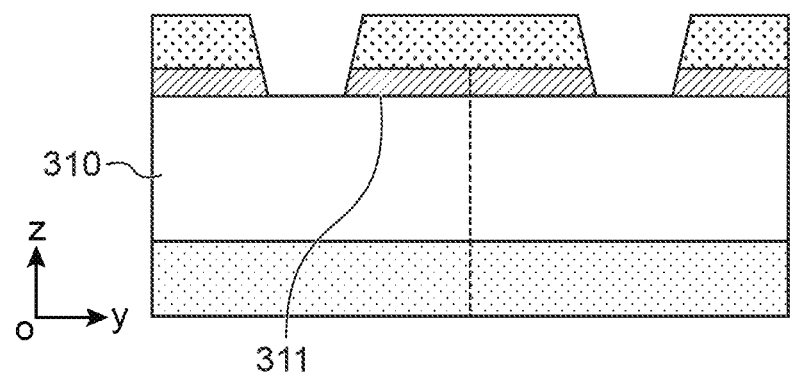
FIG. 3 schematically illustrates a variant of the method according to the first embodiment of the invention.

FIG. 3 illustrates a variant of the method according to the first embodiment of the invention, wherein etching the source coating (first etching step) does not etch the material of the semiconductor substrate 310. The upper face 311 of the semiconductor substrate remains planar in its entirety. Such a totally selective etching may also be implemented in a variant of the method according to the second embodiment of the invention.

Figure 4A:
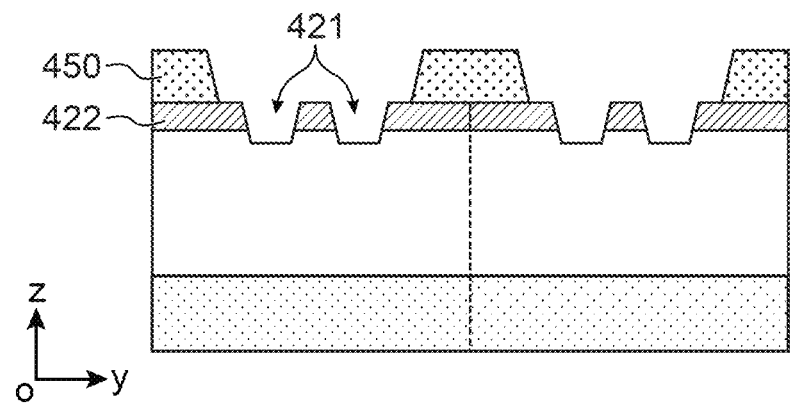
FIGS. 4A and 4B schematically illustrate the steps of a method according to a third embodiment of the invention.
Figure 4B:
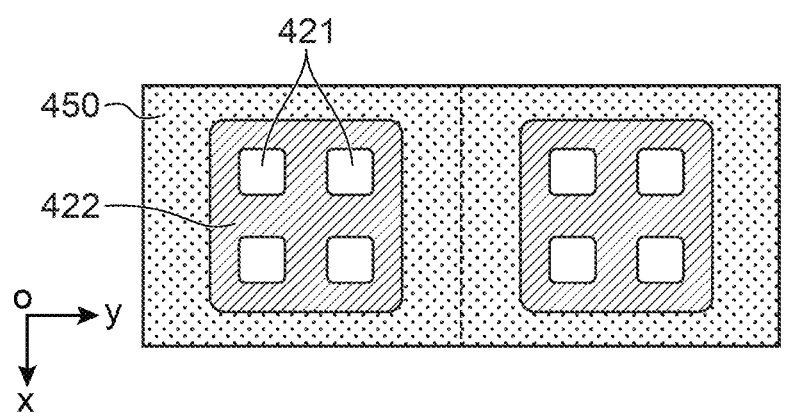

FIGS. 4A and 4B schematically illustrate the steps of a method according to a third embodiment of the invention. Only the difference of this embodiment with regards to the first embodiment will be described. In this embodiment, the first etching mask includes, for each pixel of the photodetection device, a plurality of through openings. The source coating is etched, to form a structured coating 422 with as many through openings as the first etching mask. Hence, the structured coating 422 includes, in each pixel, a plurality of through openings 421.

At the second etching step, in each pixel, the several through openings of a structure on top of the structured coating are combined together in one single through opening. In this instance, said structure is formed by the first etching mask. Alternatively, it may be formed by a sacrificial layer, as in the embodiment of FIGS. 2A to 2C. Thus, the second etching step forms a second etching mask 450, with one through opening per pixel of the photodetection device. In the photodetection device obtained ultimately, the P doped region therefore includes several protrusions, each opposite a respective through opening of the structured coating. Furthermore, the concentrated well of each P doped region includes several intermediate doping areas, each opposite a respective through opening of the structured coating. Finally, in each pixel, the electrical contact pad includes several excrescences, each coming into contact with a respective intermediate doping area throughout a respective through opening of the structured coating. This embodiment allows ensuring an optimum collection of the charge carriers, and offering a proper modulation transfer function.

The invention is limited neither to arsenic as an acceptor doping element, nor to the implantation energies and doses mentioned in the examples. Other acceptor doping elements such as Li, Na, K, Rb, Cs, Ag, Au, Cu, N, P, Sb, etc., may be used in particular, with implantation energies advantageously comprised between 50 keV and 1000 keV for structured coatings with a thickness comprised between 50 nm and 1000 nm. Similarly, the invention is not limited to the dimensions and materials mentioned as example. It is neither limited to one shape or to a number of through openings per pixel in the structured coating. For example, it could be possible to have one annular through opening per pixel in the structured coating, consequently with a P doped region with an annular protrusion and a concentrated well with an annular intermediate gap area.

Thus, the invention provides a method for making at least one low-noise P/N photodiode. In each pixel, a contact surface between the electrical contact made of metal and the P doped region is automatically aligned, by its mere construction, with an intermediate gap area in the P doped region dedicated to the collection of the charge carriers. Preferably, the electrical contact is, by its mere construction, perfectly centred on the P doped region. The invention is particularly adapted to the manufacture of matrix-type photodetection devices, with a distribution step of the pixels smaller than or equal to 10 μm.

What is claimed is:

1. A method for manufacturing a photodetection device, which includes the following steps:
   a) depositing, over a semiconductor substrate of $Cd_xHg_{1-x}Te$, a source coating which includes, at least, one cadmium-rich layer having a higher average concentration of cadmium than the semiconductor substrate, with the cadmium-rich layer in direct physical contact with an upper face of the semiconductor substrate;
   b) making a first etching mask, superimposed on the source coating on the side opposite to the semiconductor substrate;
   c) a first etching step, to etch the source coating throughout the first etching mask and to thus form at least one first through opening in the source coating, the source coating fitted with the at least one first through opening being called structured coating;
   d) a second etching step, to enlarge at least one second through opening in a structure on top of the structured coating on completion of the first etching step, and to thus form a second etching mask;
   e) injecting acceptor doping elements into the semiconductor substrate, throughout through openings of the second etching mask, with the acceptor doping elements that locally pass through the structured coating;
   f) activating and diffusing the acceptor doping elements, to form at least one P doped region in the semiconductor substrate;
   g) selective interdiffusion annealing of cadmium, implemented after step f) or at least partially simultaneously with step f), during which the cadmium atoms diffuse from the structured coating towards the at least one P doped region, so as to form in each P doped region a concentrated well with at least one intermediate gap area and at least one high gap area, where the intermediate gap area has an average concentration of cadmium strictly lower than the average concentration of cadmium in the high gap area; and
   h) depositing a metal layer coming into contact with the semiconductor substrate at the at least one first through opening in the structured coating, to form at least one electrical contact pad.

2. The method of claim 1, wherein:
   at step b), the first etching mask is made directly over the source coating, on the side opposite to the semiconductor substrate; and
   at step d), the structure on top of the structured coating on completion of the first etching step is constituted by the first etching mask, so that the second etching mask is formed in the material of the first etching mask.

3. The method of claim 2, wherein a thickness of the first etching mask is adapted so that, on completion of step d), the second etching mask has a thickness larger than or equal to a limit threshold below which, at step e), the acceptor doping elements would pass through the second etching mask between the through openings of the latter.

4. The method of claim 1, further including, between steps a) and b), a step of depositing a sacrificial layer over the source coating, on the side opposite to the semiconductor substrate, and wherein:
   at step b), the first etching mask is made over the sacrificial layer, on the side opposite to the semiconductor substrate;
   at step c), the sacrificial layer is etched together with the source coating, throughout the first etching mask;
   at step d), the structure on top of the structured coating on completion of the first etching step is constituted by the etched sacrificial layer, so that the second etching mask is formed in the material of the sacrificial layer.

5. The method of claim 4, further including a step of removing the first etching mask, implemented after step d) and before step e).

6. The method of claim 1, wherein at step d), an etching depth, in radial directions parallel to the plane of the semiconductor substrate, is larger than or equal to 1 μm.

7. The method of claim 1, further including a step of filling mercury gaps, to form in the semiconductor substrate an N doped region forming a respective PN junction with each P doped region.

8. The method of claim 1, wherein on completion of step d), the second etching mask includes as many through opening(s) as the first etching mask.

9. The method of claim 1, wherein at step d), several second through openings of the structure are combined so as to form one single through opening, so that on completion of step d) the second etching mask includes less through openings than the first etching mask.

10. A photodetection device with at least one pixel, obtained using the method of claim 1, and including:
    a $Cd_xHg_{1-x}Te$ semiconductor substrate;
    a structured coating, covering an upper face of the semiconductor substrate, and provided with at least one first through opening; and
    at least one electrical contact pad, made of metal;
    wherein the semiconductor substrate includes, for each pixel:
    an N doped region;
    a P doped region, forming a PN junction with the N doped region, flush with the upper face of the semiconductor substrate, and in direct physical contact with a respective one amongst the at least one electrical contact pad; and
    a concentrated well, located only in the P doped region and having an average concentration of cadmium higher than the average concentration of cadmium in the N doped region;
    wherein in each pixel:
    the P doped region includes a base which extends from the upper face of the semiconductor substrate and at least one protrusion which projects from the base in the direction opposite to said upper face of the semiconductor substrate;
    the concentrated well features a cadmium concentration gradient, defining in the latter at least one intermediate gap area and at least one high gap area, with the intermediate gap area which has an average concentration of cadmium strictly lower than the average concentration of cadmium in the high gap area; and each intermediate gap area is in direct physical contact with said respective electrical contract pad, at least at one corresponding first through opening of the structured coating.

11. The photodetection device of claim 10, wherein each pixel includes one single intermediate gap area and one single high gap area, with the intermediate gap area arranged concentrically with the P doped region and surrounded by the high gap area.

\* \* \* \* \*